(12) United States Patent
Kang

(10) Patent No.: US 10,707,151 B2
(45) Date of Patent: Jul. 7, 2020

(54) THROUGH SILICON VIA STRUCTURE AND METHOD FOR MANUFACTURING THE SAME

(71) Applicant: NANYA TECHNOLOGY CORPORATION, New Taipei (TW)

(72) Inventor: Ting-Cih Kang, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 16/262,134

(22) Filed: Jan. 30, 2019

(65) Prior Publication Data

US 2020/0161221 A1 May 21, 2020

Related U.S. Application Data

(60) Provisional application No. 62/769,833, filed on Nov. 20, 2018.

(51) Int. Cl.
| | |
|---|---|
| *H01L 23/48* | (2006.01) |
| *H01L 23/532* | (2006.01) |
| *H01L 23/00* | (2006.01) |
| *H01L 21/02* | (2006.01) |
| *H01L 21/768* | (2006.01) |

(52) U.S. Cl.
CPC ...... *H01L 23/481* (2013.01); *H01L 21/02238* (2013.01); *H01L 21/02255* (2013.01); *H01L 21/76852* (2013.01); *H01L 21/76871* (2013.01); *H01L 21/76898* (2013.01); *H01L 23/53238* (2013.01); *H01L 23/562* (2013.01)

(58) Field of Classification Search
CPC ............. H01L 23/481; H01L 21/02238; H01L 21/02255; H01L 21/76852; H01L 21/76871; H01L 21/76898; H01L 23/53238; H01L 23/562
See application file for complete search history.

(56) References Cited

U.S. PATENT DOCUMENTS

| | | | | |
|---|---|---|---|---|
| 6,045,666 | A * | 4/2000 | Satitpunwaycha | ............................ C23C 14/0036 204/192.12 |
| 7,517,798 | B2 * | 4/2009 | Tuttle | ................. H01L 21/76898 257/E21.476 |
| 7,683,458 | B2 * | 3/2010 | Akram | ................. H01L 21/6835 257/621 |
| 7,964,502 | B2 * | 6/2011 | Dao | ................... H01L 21/76847 257/621 |
| 8,242,604 | B2 * | 8/2012 | Volant | .................... H01L 23/481 257/774 |
| 8,519,528 | B1 * | 8/2013 | Nagarajan | ......... H01L 23/49827 257/698 |

(Continued)

*Primary Examiner* — Earl N Taylor
(74) *Attorney, Agent, or Firm* — Muncy, Geissler, Olds & Lowe, P.C.

(57) ABSTRACT

The present disclosure provides a through silicon via structure and a method for manufacturing the same. The through silicon via structure includes a semiconductor substrate, a shaping film, a conductive line, a barrier layer, and an insulating layer. The shaping film is disposed over a back surface of the semiconductor substrate, and is configured to maintain a planar formation of the semiconductor substrate. The conductive line is disposed through the shaping film and in the semiconductor substrate. The barrier layer surrounds the conductive line, and the insulating layer surrounds the barrier layer.

14 Claims, 16 Drawing Sheets

(56) References Cited

U.S. PATENT DOCUMENTS

| | | | |
|---|---|---|---|
| 9,466,569 B2* | 10/2016 | Shroff | H01L 23/53238 |
| 9,673,316 B1* | 6/2017 | Blair | H01L 29/7802 |
| 9,704,784 B1* | 7/2017 | Lagouge | H01L 23/481 |
| 9,716,035 B2* | 7/2017 | Yang | H01L 23/53238 |
| 9,812,359 B2* | 11/2017 | Chen | H01L 21/76898 |
| 10,388,567 B2* | 8/2019 | Chen | H01L 21/76898 |
| 2005/0121768 A1* | 6/2005 | Edelstein | H01L 21/486 257/698 |
| 2010/0035430 A1* | 2/2010 | Andry | H01L 21/76898 438/667 |
| 2010/0193954 A1* | 8/2010 | Liu | H01L 21/76898 257/751 |
| 2010/0323478 A1* | 12/2010 | Kuo | H01L 21/76898 438/124 |
| 2011/0240481 A1* | 10/2011 | Keigler | H01L 21/2885 205/131 |
| 2012/0295437 A1* | 11/2012 | Lu | H01L 21/76898 438/653 |
| 2013/0234325 A1* | 9/2013 | Dai | H01L 23/49811 257/737 |
| 2014/0124900 A1* | 5/2014 | West | H01L 21/76898 257/621 |
| 2014/0264911 A1* | 9/2014 | Lin | H01L 23/481 257/774 |
| 2014/0302674 A1* | 10/2014 | Ramachandran | H01L 21/76898 438/667 |
| 2015/0061147 A1* | 3/2015 | Lin | H01L 23/53238 257/774 |
| 2015/0115445 A1* | 4/2015 | Jindal | H01L 23/481 257/741 |
| 2015/0137323 A1* | 5/2015 | Zhou | H01L 21/76898 257/621 |
| 2015/0137387 A1* | 5/2015 | Choi | H01L 23/481 257/774 |
| 2015/0206823 A1* | 7/2015 | Lin | H01L 21/76877 257/774 |
| 2015/0214160 A1* | 7/2015 | Bossler | H01L 21/3065 257/751 |
| 2015/0364400 A1* | 12/2015 | Dando | H01L 23/481 257/774 |
| 2016/0049371 A1* | 2/2016 | Lee | H01L 21/76898 257/621 |
| 2016/0099201 A1* | 4/2016 | Choi | H01L 23/481 257/621 |
| 2016/0358802 A1* | 12/2016 | Moslehi | H01L 21/6833 |
| 2016/0358821 A1* | 12/2016 | Chen | H01L 21/76898 |
| 2017/0148674 A1* | 5/2017 | Lu | H01L 21/76831 |
| 2018/0040511 A1* | 2/2018 | Kamineni | H01L 21/76898 |
| 2018/0204803 A1* | 7/2018 | Herdt | H01L 23/53238 |
| 2018/0286783 A1* | 10/2018 | Kume | H01L 21/02126 |
| 2018/0374750 A1* | 12/2018 | Zhang | H01L 21/67138 |
| 2019/0067089 A1* | 2/2019 | Yang | H01L 21/76811 |
| 2019/0067228 A1* | 2/2019 | Son | H01L 24/13 |
| 2019/0252445 A1* | 8/2019 | Kao | H01L 27/14634 |
| 2019/0385966 A1* | 12/2019 | Gao | H01L 23/481 |

* cited by examiner

THROUGH SILICON VIA STRUCTURE AND METHOD FOR MANUFACTURING THE SAME

PRIORITY CLAIM AND CROSS-REFERENCE

This application claims the priority benefit of U.S. provisional application Ser. No. 62/769,833, filed on Nov. 20, 2018. The entirety of the above-mentioned patent application is hereby incorporated by reference herein and made a part of this specification.

TECHNICAL FIELD

The present disclosure relates to a semiconductor structure and a method for manufacturing the same, and more particularly, to a through silicon via structure and a method for manufacturing the same.

DISCUSSION OF THE BACKGROUND

As semiconductor devices, such as memory devices, are becoming increasingly integrated, achieved degree of integration with typical two-dimensional (2D) structures is rapidly approaching its limit. Therefore, there is a need for a semiconductor memory device having a three-dimensional (3D) structure that exceeds the 2D structure in integration capability. Such need has led to extensive research into developing 3D semiconductor memory device technology.

In a 3D semiconductor memory device, various signals carrying data, commands, or addresses are transmitted, some or all of which are transmitted through a through silicon via (TSV). However, a large thermal expansion mismatch exists between the substrate and metal filler (such as copper), resulting in substrate stress and warpage, which strongly impact TSV performance and reliability.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a through silicon via structure. The through silicon via structure includes a semiconductor substrate, a shaping film, a conductive line, a barrier layer, and an insulating layer. The shaping film is disposed over a back surface of the semiconductor substrate, and the shaping film is configured to maintain a planar formation of the semiconductor substrate. The conductive line is disposed through the shaping film and in the semiconductor substrate. The barrier layer surrounds the conductive line, and the insulating layer surrounds at least a portion of the barrier layer.

In some embodiments, the semiconductor substrate has a first coefficient of thermal expansion, the conductive line has a second coefficient of thermal expansion greater than the first coefficient of thermal expansion, and the shaping film has a third coefficient of thermal expansion less than the first coefficient of thermal expansion.

In some embodiments, the shaping film includes a compressive material and applies compression to the semiconductor substrate when the semiconductor substrate bulges toward the back surface due to warping.

In some embodiments, the shaping film includes compressive silicon oxide, silicon nitride, or high compressive nitride.

In some embodiments, the shaping film includes a tensile material and applies tension to the semiconductor substrate when the semiconductor substrate bulges toward a front surface opposite to the back surface due to warping.

In some embodiments, the shaping film includes gallium nitride.

In some embodiments, the shaping film is a multi-layered structure and includes one or more first layers and one or more second layers arranged in a staggered configuration, wherein one of the first layers includes oxide and is connected to the back surface.

In some embodiments, the second layer includes polysilicon or photoresist.

In some embodiments, a first end surface of the conductive line and a terminal surface of the barrier layer are coplanar with a lower surface, away from the back surface, of the shaping film.

In some embodiments, a second end surface of the conductive line, opposite to the first end surface of the conductive line, is interfaced with the barrier layer.

In some embodiments, the insulating layer is a thermal oxide layer, and a terminal surface of the insulating layer is coplanar with the back surface.

In some embodiments, the insulating layer is a deposition layer, and a terminal surface of the insulating layer is coplanar with the lower surface.

In some embodiments, the through silicon via structure further includes a seed layer disposed between the conductive line and the barrier layer.

In some embodiments, the barrier layer, the insulating layer, and the seed layer have uniform thicknesses.

Another aspect of the present disclosure provides a method for manufacturing a through silicon via structure. The method includes steps of providing a semiconductor substrate; depositing a shaping film over a back surface of the semiconductor substrate; forming a hole through the shaping film and in the semiconductor substrate; forming an insulating layer in the hole; depositing a barrier layer over the insulating layer; and depositing a conductive material in the hole.

In some embodiments, the step of forming a hole through the shaping film and in the semiconductor substrate includes steps of providing a patterned photoresist over the shaping film and etching unnecessary portions of the shaping film and the semiconductor substrate away by using the patterned photoresist as a mask.

In some embodiments, the method further includes a step of removing the patterned photoresist after the depositing of the conductive material.

In some embodiments, the method further includes a step of depositing a seed layer over the barrier layer.

In some embodiments, the insulating layer is formed by a thermal oxidation process.

With the above-mentioned configurations of the through silicon via structure, the stress applied to the semiconductor substrate can be reduced, and warping of the semiconductor substrate can thus be reduced.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
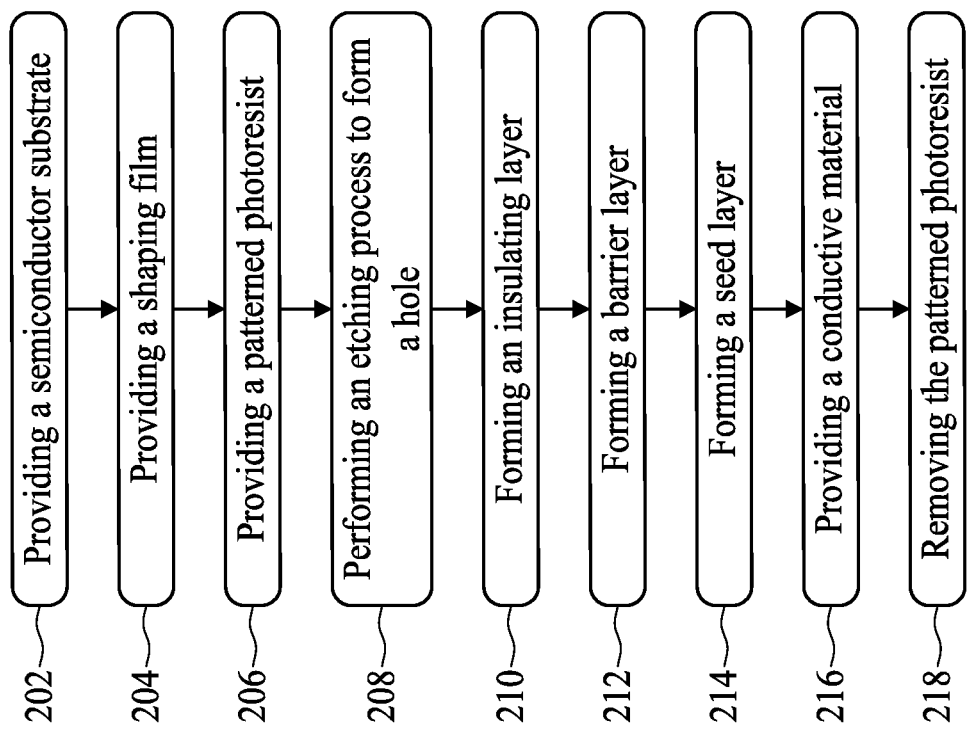
FIG. 1 is a flow diagram illustrating a method for manufacturing a through silicon via structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely configured to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a flow diagram illustrating a method 200 for manufacturing a through silicon via structure 300 in accordance with some embodiments of the present disclosure. FIGS. 2 to 10 are schematic diagrams illustrating various fabrication stages constructed according to the method 200 for manufacturing the through silicon via structure 300 in accordance with some embodiments of the present disclosure. The stages shown in FIGS. 2 through 10 are also illustrated schematically in the process flow in FIG. 1. In the subsequent discussion, the fabrication stages shown in FIGS. 2 through 10 are discussed in reference to the process steps in FIG. 1.

Figure 2:
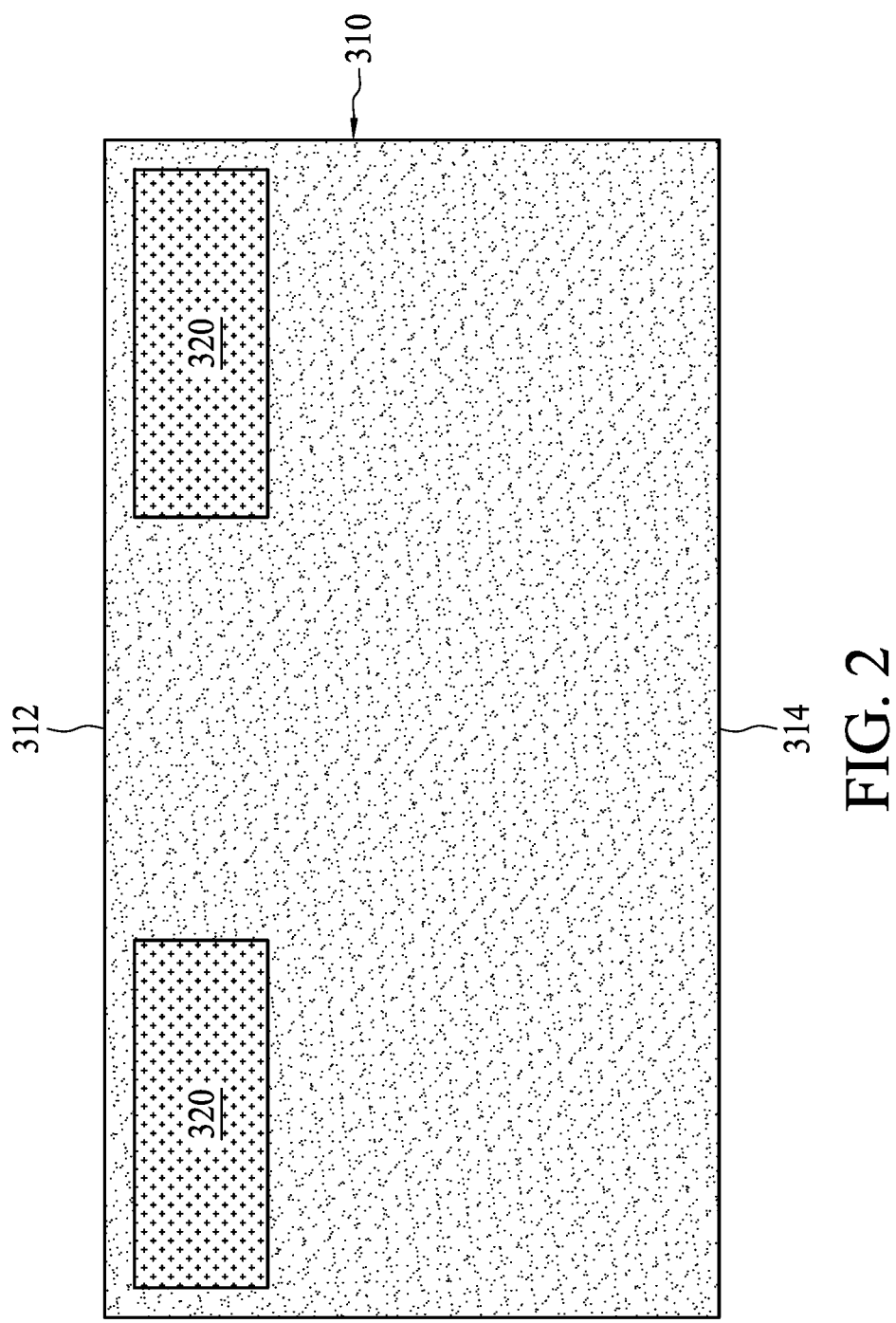
FIGS. 2 to 10 illustrate cross-sectional views of intermediate stages in the formation of a through silicon via structure in accordance with some embodiments of the present disclosure.

Referring to FIG. 2, a semiconductor substrate 310 having a first coefficient of thermal expansion (CTE) is provided according to a step 202 in FIG. 1. In some embodiments, the semiconductor substrate 310 has a front surface 312 and a back surface 314 opposite to the front surface 312. In some embodiments, the semiconductor substrate 310 includes a plurality of semiconductor devices 320 disposed thereon. In some embodiments, the semiconductor devices 320 disposed on the semiconductor substrate 310 are close to the front surface 312. In some embodiments, the semiconductor substrate 310 is a silicon substrate.

Figure 3:
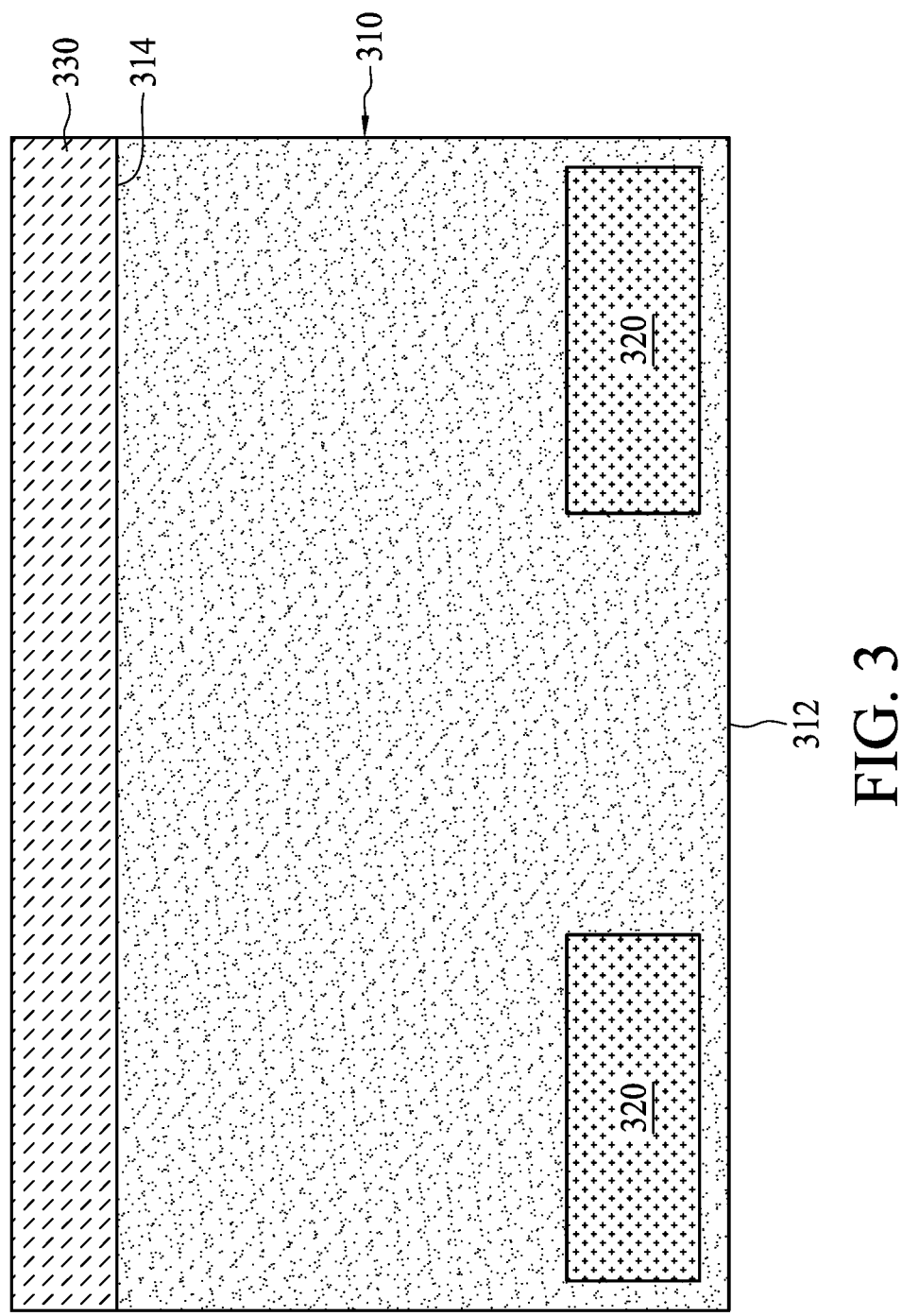

Referring to FIG. 3, a shaping film 330 is provided over the back surface 314 according to a step 204 in FIG. 1. In some embodiments, a thickness of the shaping film 330 is substantially less than a thickness of the semiconductor substrate 310. In some embodiments, the shaping film 330 fully covers the back surface 314. In some embodiments, the shaping film 330 is a single-layered structure or a multi-layered structure, and includes tensile material or compressive material, as will be described later.

Figure 4:
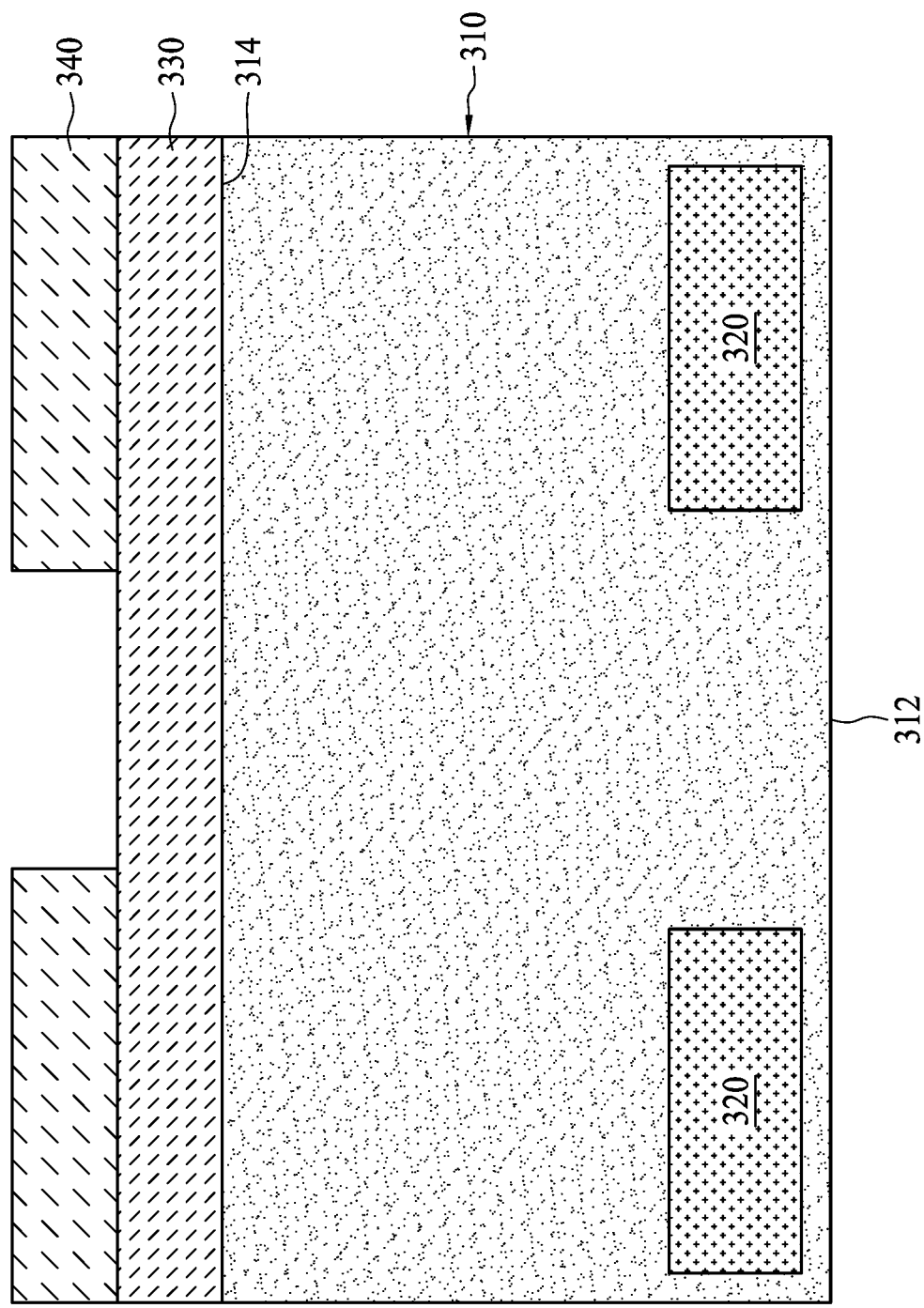

Referring to FIG. 4, a patterned photoresist 340 is provided over the shaping film 330 according to a step 206 in FIG. 1. In some embodiments, the patterned photoresist 340 is formed by disposing an unpatterned photoresist layer to fully cover the shaping film 300, then removing portions of the photoresist layer in accordance with a predefined pattern. The remaining portion of the photoresist layer forms the patterned photoresist 340.

Figure 5:
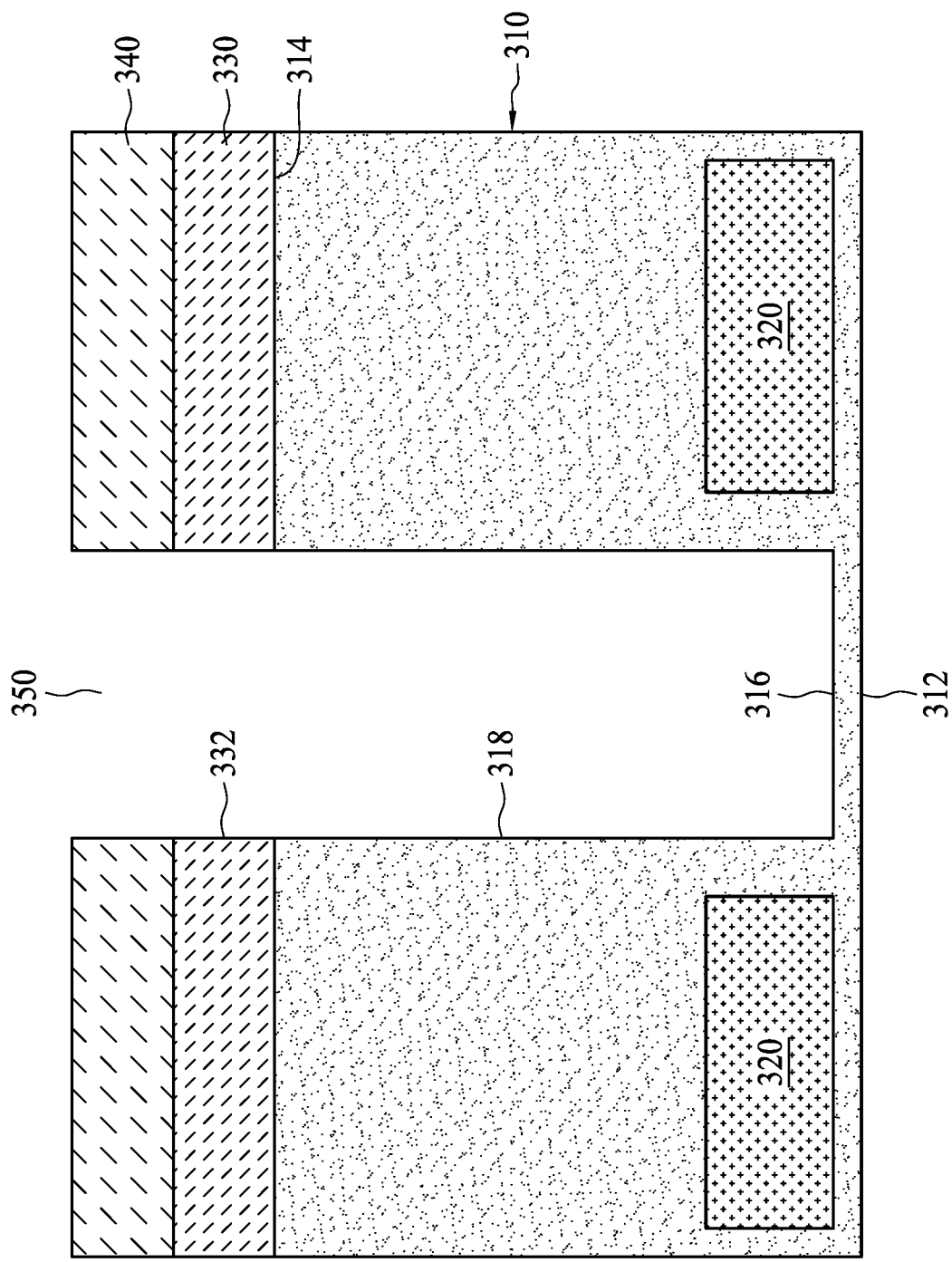

Referring to FIG. 5, in some embodiments, an etching process is performed to form a hole 350 according to a step 208 in FIG. 1. In some embodiments, the etching process uses the patterned photoresist 340 to define an area to be etched and to protect other regions of the shaping film 330 and the semiconductor substrate 310. In some embodiments, after the etching process is performed, the semiconductor substrate 310 and the shaping film 330 remain only in portions that are below the patterned photoresist 340. In some embodiments, unnecessary portions of the shaping film 330 and the semiconductor substrate 310 are etched away by using the patterned photoresist 340 as a mask.

In some embodiments, the hole 350 is formed through the shaping film 330 and in the semiconductor substrate 310. In some embodiments, the hole 350 is formed in a region of the semiconductor substrate 310 where the semiconductor devices 320 are not disposed. In some embodiments, the hole 350 is disposed between the semiconductor devices 320. In some embodiments, the etching process includes a wet etching process, a dry etching process, or a combination thereof. In some embodiments, the remaining semiconductor substrate 310 has a first wall 316 substantially parallel to the back surface 314 and a second wall 318 adjacent to the first wall 316. In some embodiments, the remaining shaping film 330 has a sidewall 332 being continuous with the second wall 318.

Figure 6:
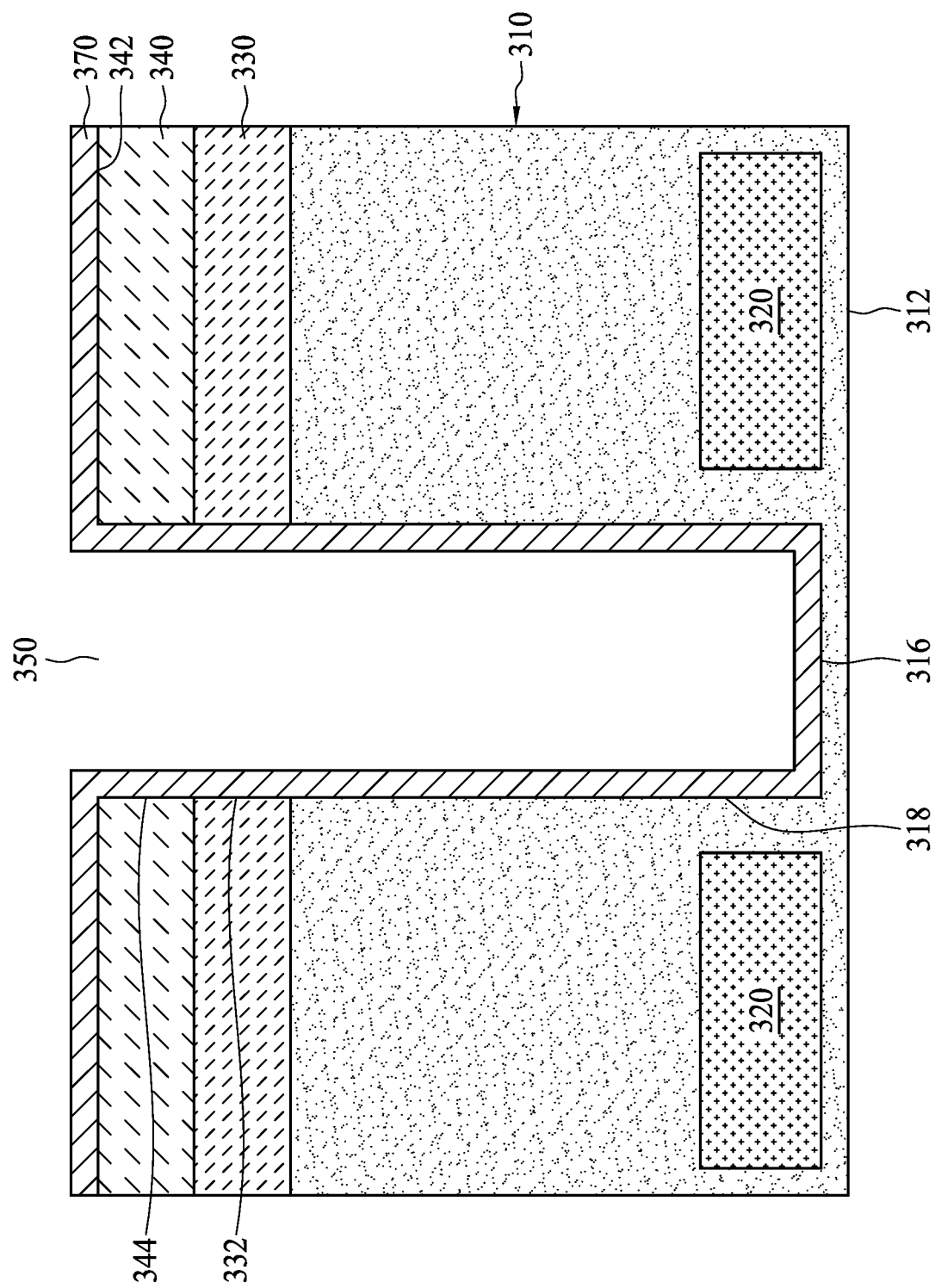

Referring to FIG. 6, in some embodiments, an insulating layer 370 is deposited over the patterned photoresist 340 and in the hole 350 according to a step 210 in FIG. 1. In some embodiments, the insulating layer 370 is formed on a first surface 342 and a second surface 344 of the patterned photoresist 340, the sidewall 332, the first wall 316, and the second wall 318, wherein the first surface 342 is substantially parallel to the back surface 314, and the second surface 344 is adjacent to the first surface 342. In some embodiments, the second surface 344 is continuous with the sidewall 332. In the embodiments, the insulating layer 370 has a uniform thickness. In some embodiments, the insulating layer 370 includes oxide. In some embodiments, the insulating layer 370 includes silicon oxide. In some embodiments, the insulating layer 370 is formed by a chemical vapor deposition (CVD) process or a physical vapor deposition (PVD) process.

Figure 7:
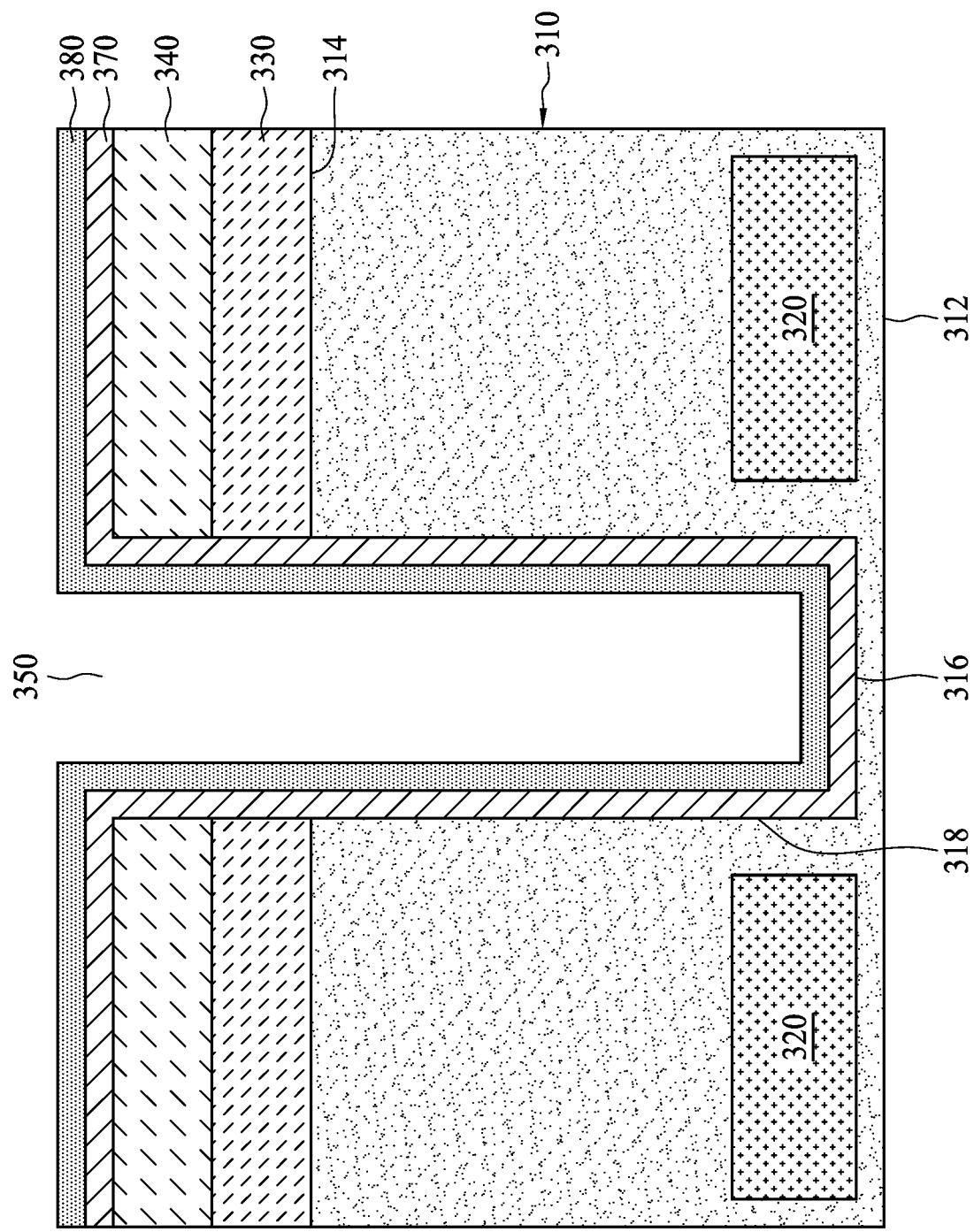

Referring to FIG. 7, in some embodiments, a barrier layer 380 is formed over the insulating layer 370 according to a step 212 in FIG. 1. In some embodiments, the barrier layer 380 has a uniform thickness. In some embodiments, the barrier layer 380 includes titanium. In some embodiments, the barrier layer 380 is formed by a CVD process or a PVD process.

Figure 8:
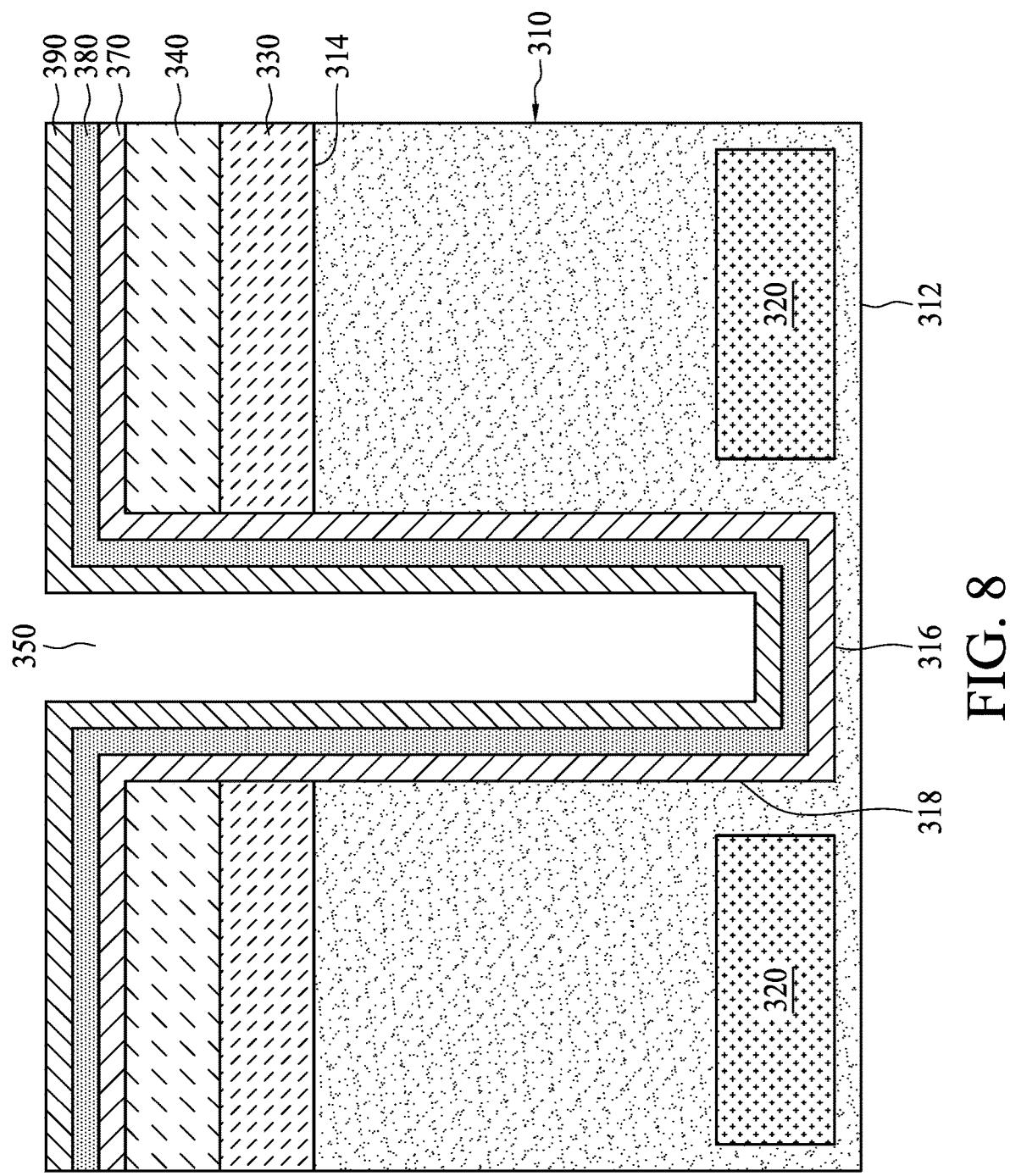

Referring to FIG. 8, in some embodiments, an optional seed layer 390 is formed over the barrier layer 380 according to a step 214 in FIG. 1. In some embodiments, the seed layer 390 is configured to improve adhesion and facilitate growth of the conductive line, as will be described later. In some embodiments, the seed layer 390 has a uniform thickness. In some embodiments, the seed layer 390 is formed by a CVD process or a PVD process.

Figure 9:
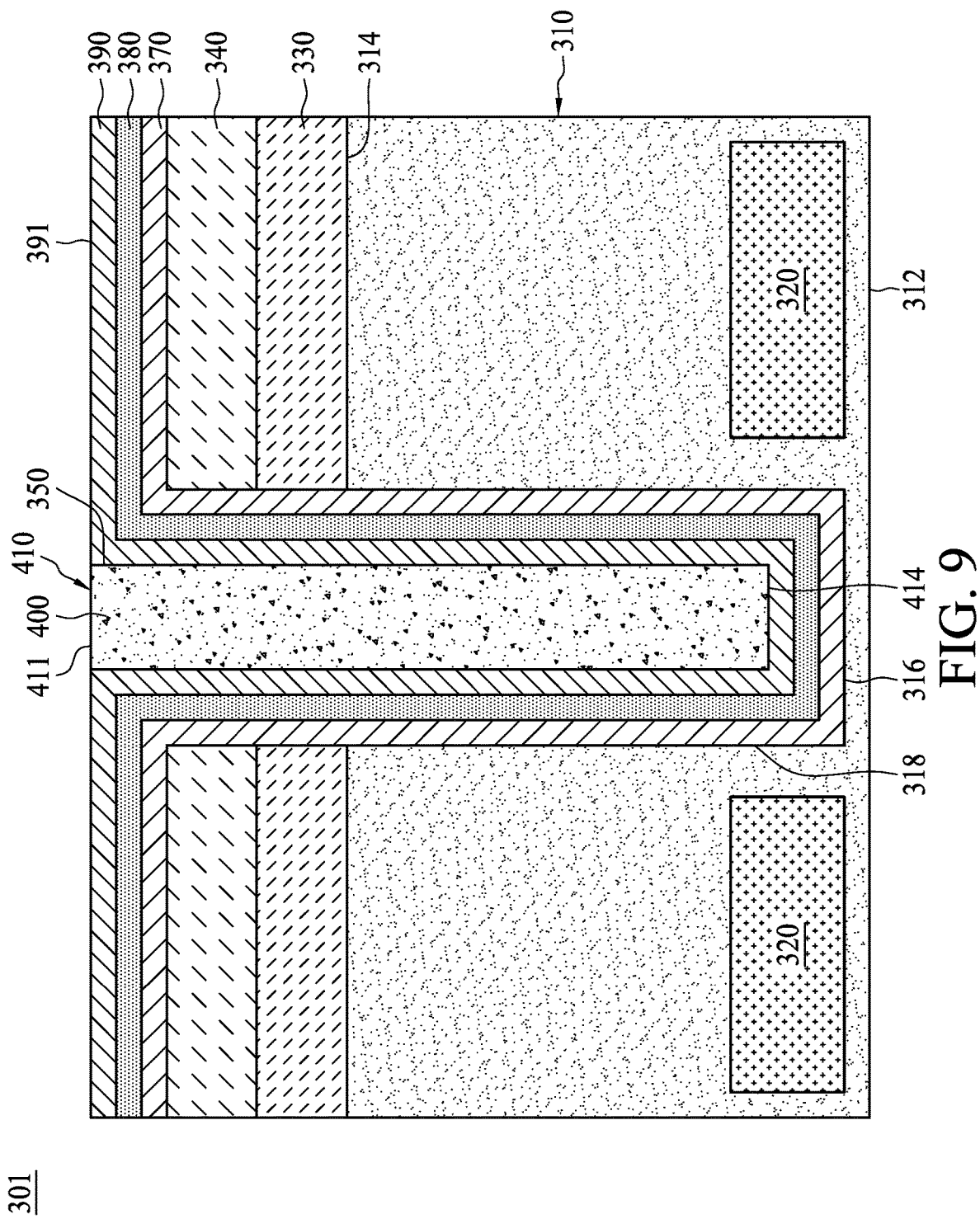

Referring to FIG. 9, in some embodiments, a conductive material 400 is deposited in the hole 350 surrounded by the seed layer 390 according to a step 216 in FIG. 1. In some embodiments, the conductive material 400 has a second coefficient of thermal expansion different from the first coefficient of thermal expansion. In some embodiments, the first coefficient of thermal expansion is less than the second coefficient of thermal expansion. In some embodiments, the conductive material 400 has a thickness sufficient to fill the hole 350. In some embodiments, a planarizing process is performed on a semiconductor structure 301 shown in FIG. 9 to remove excess portions of the conductive material 400 over an end surface 391 of the seed layer 390 so that a conductive line 410 is formed. In some embodiments, the planarizing process includes a chemical mechanical polishing (CMP) process. In some embodiments, the conductive line 410 has a first end surface 411 that is coplanar with the end surface 391 and a second end surface 414 that is interfaced with the seed layer 390, wherein the second end surface 414 is substantially parallel to the first end surface 411. In some embodiments, the conductive material 400 includes copper.

Figure 10:
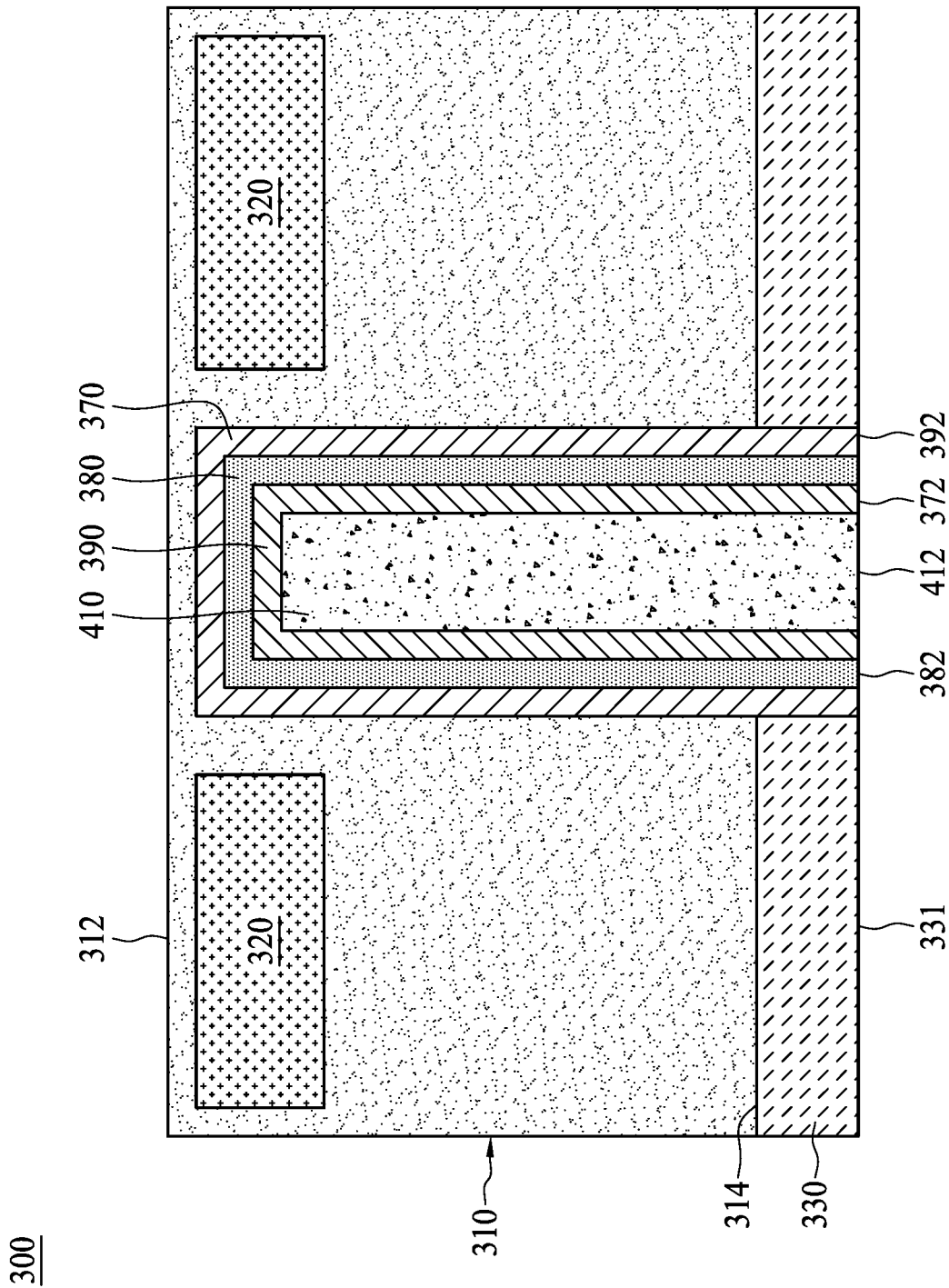

Referring to FIG. 10, in some embodiments, the patterned photoresist 340, and portions of the insulating layer 370, the barrier layer 380, the seed layer 390, and the conductive material 400 are properly removed to expose a lower surface 331 of the shaping film 330 according to a step 218 in FIG. 1. As a result, the through silicon via structure 300 of the present disclosure is completely formed. In some embodiments, the through silicon via structure 300 includes a semiconductor substrate 310, a shaping film 330, an insulating layer 370, a barrier layer 380, and a conductive line 410. In some embodiments, the shaping film 330 is disposed on a back surface 314 of the semiconductor substrate 310, and the conductive line 410 is disposed through the shaping film 330 and in the semiconductor substrate 310. In some embodiments, the barrier layer 380 surrounds the conductive line 410, and the insulating layer 370 at least surrounds a portion of the barrier layer 380.

In some embodiments, the through silicon via structure 300 further includes a seed layer 390 disposed between the conductive line 410 and the insulating layer 370. In some embodiments, the insulating layer 370, the barrier layer 380, and the seed layer 390 have uniform thicknesses. In some embodiments, terminal surfaces 372, 382 and 392 of the insulating layer 370, the barrier layer 380 and the seed layer 390, respectively, and a first end surface 412 of the conductive line 410 are substantially coplanar with a lower surface 331 of the shaping film 330. In some embodiments, the through silicon via structure 300 further includes a plurality of semiconductor devices 320 disposed in the semiconductor substrate 310 and near the front surface 312 of the semiconductor substrate 310, wherein the front surface 312 is opposite to the back surface 314. In some embodiments, the conductive line 410 is disposed between the semiconductor devices 320.

In some embodiments, the semiconductor substrate 310 has a first coefficient of thermal expansion, and the conductive line 410 has a second coefficient of thermal expansion greater than the first coefficient of thermal expansion. Notably, when the second coefficient of thermal expansion of the conductive material 400 is different from the first coefficient of thermal expansion of the semiconductor substrate 310, a problem of coefficient of thermal expansion mismatch between the semiconductor substrate 310 and the conductive line 410 occurs because the conductive line 410, having a higher coefficient of thermal expansion, undergoes greater heat stress during a heat process. As a result, the semiconductor substrate 310 is warped. Thus, the shaping film 330, which has a third coefficient of thermal expansion less than the first coefficient of thermal expansion, is provided to maintain a planar formation of the semiconductor substrate 310.

Figure 11B:
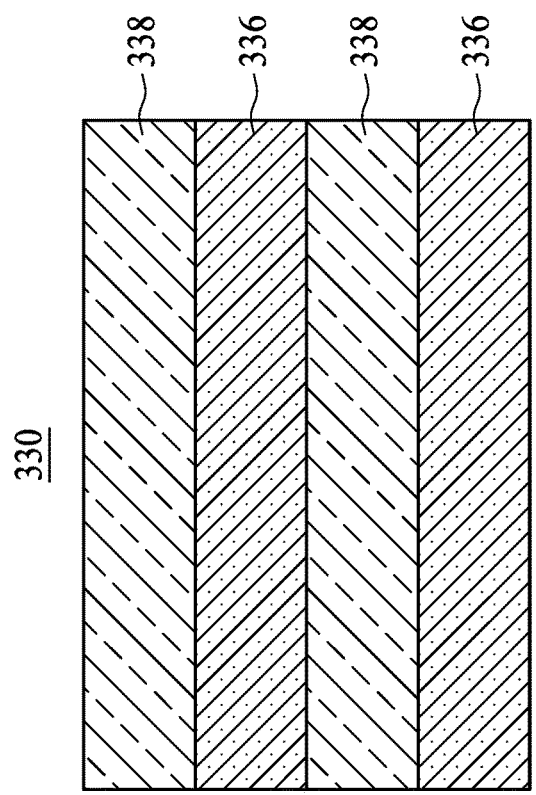
FIGS. 11A and 11B illustrate cross-sectional views of a shaping film in FIG. 10 in accordance with some embodiments of the present disclosure.
Figure 11A:
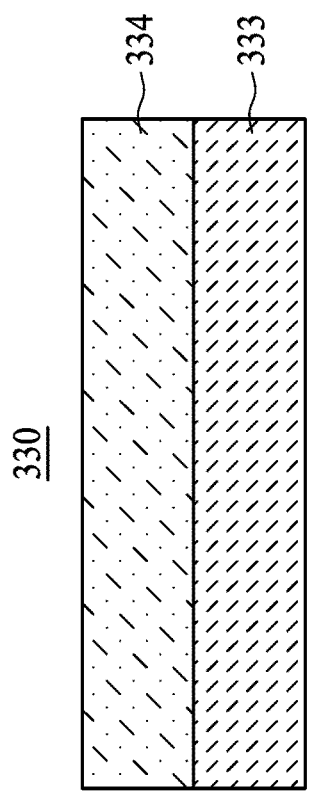

In some embodiments, the semiconductor substrate 310 of the through silicon via structure 300 becomes warped, i.e., bulges toward the front surface 312, when a compressive stress is applied to the semiconductor substrate 310. In such situation, the shaping film 330 can include a tensile material to prevent the semiconductor substrate 310 from deforming (i.e., warping), so that the semiconductor substrate 310 can maintain the planar formation. In some embodiments, the shaping film 330 having the tensile material is a single-layered structure including gallium nitride. In some embodiments, the shaping film 330 including tensile material is a multi-layered structure including a first layer 333 and a second layer 334 as shown in FIG. 11A; the first layer 333 is disposed on the back surface 314 shown in FIG. 10, and the second layer 334 is disposed on the first layer 333. In some embodiments, the first layer 333 includes silicon oxide, and the second layer 334 includes photoresist or a polysilicon. In some embodiments, the shaping film 330 including tensile material is a multi-layered structure including a plurality of third layers 336 and a plurality of fourth layers 338 in a staggered configuration as shown in FIG. 11B. In some embodiments, the third layers 336 include silicon oxide, and the fourth layers 338 include polysilicon.

In some embodiments, the semiconductor substrate 310 of the through silicon via structure 300 becomes warped, i.e., bulges toward the back surface 314, when a tensile stress is applied to the semiconductor substrate 310. In such situation, the shaping film 330 can include a compressive material to prevent the semiconductor substrate 310 from deforming. Therefore, the semiconductor substrate 310 maintains a planar formation. In some embodiments, the shaping film 330 including the compressive material is a single-layered structure and includes compressive silicon oxide, silicon nitride, or high compressive silicon nitride.

By providing the shaping film 330 on the back surface 314 of the semiconductor substrate 310, the stress applied to the semiconductor substrate 310 can be reduced to maintain the planar formation of the semiconductor substrate 310.

Figure 12:
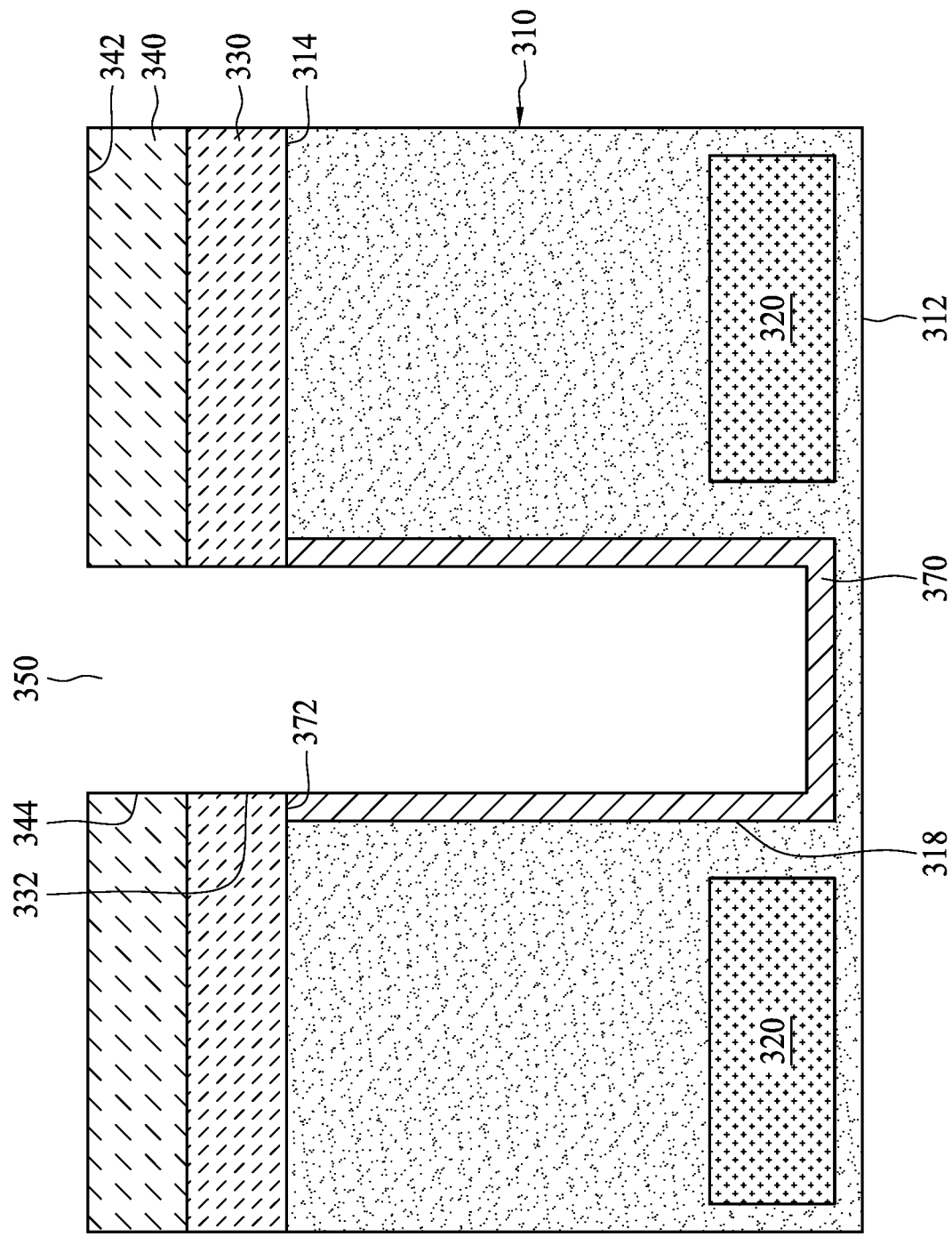
FIGS. 12 to 16 illustrate cross-sectional views of intermediate stages in the formation of the semiconductor package in accordance with some embodiments of the present disclosure.

FIG. 12 to FIG. 16 are schematic diagrams illustrating various fabrication stages constructed according to the method 200 for manufacturing the through silicon via structure 300, in accordance with some embodiments of the present disclosure. Notably, the step of FIG. 12 is carried out during pre-processing steps of FIG. 2 to FIG. 5. The steps shown in FIGS. 12 through 16 are also illustrated schematically in the process steps 210 to 218 in FIG. 1. In the subsequent discussion, the process steps shown in FIGS. 12 through 16 are discussed in reference to the process steps 210 to 218 in FIG. 1.

Referring to FIG. 12, in some embodiments, an insulating layer 370 is formed according to a step 210 in FIG. 1. In some embodiments, the insulating layer 370 is a thermal oxide layer formed by a thermal oxidation process. In some embodiments, the insulating layer 370 is a buried oxide layer. In the embodiments, the insulating layer 370 has a uniform thickness. In some embodiments, a terminal surface 372 of the insulating layer 370 is coplanar with a back surface of the semiconductor substrate 310.

Figure 13:
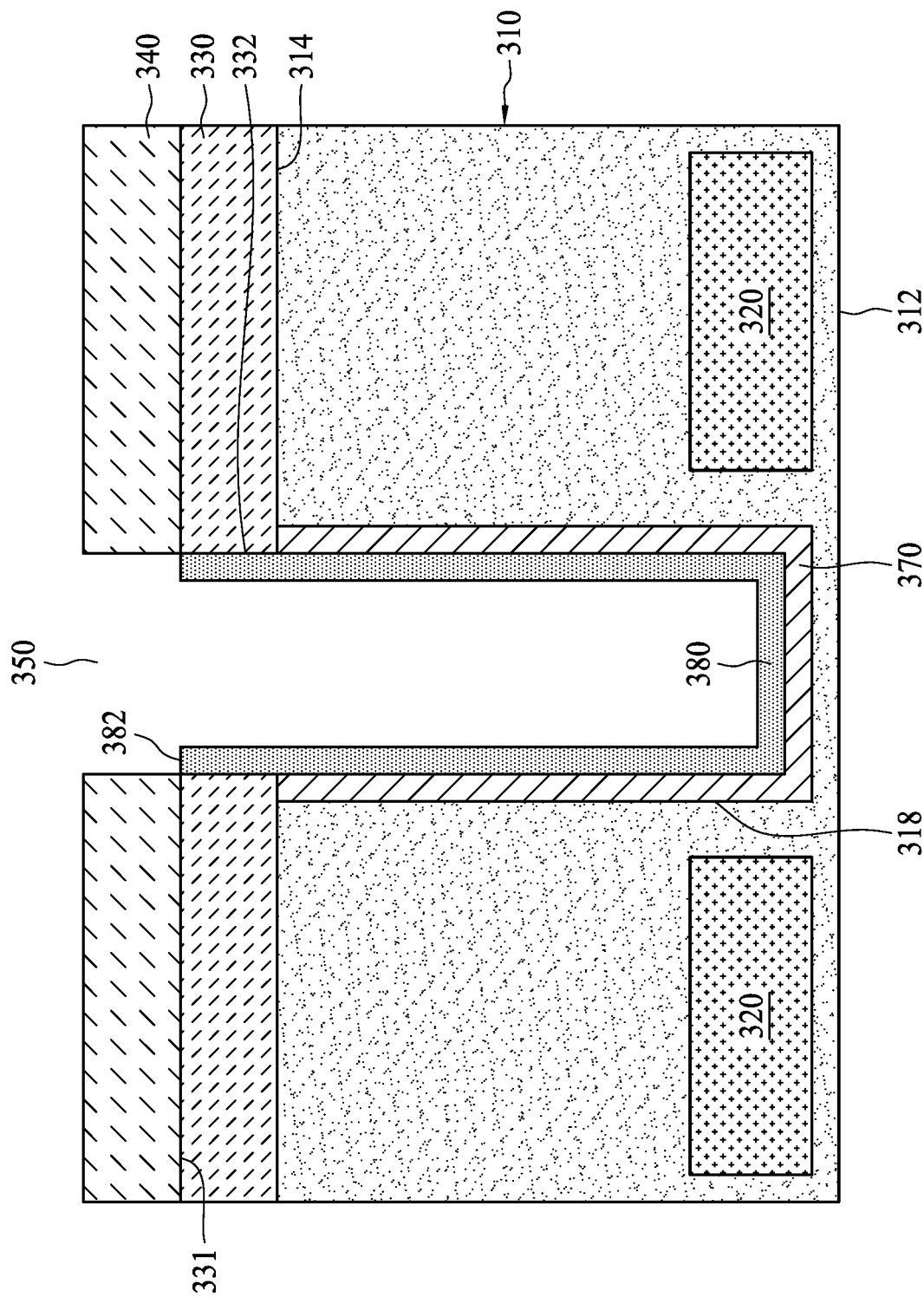

Referring to FIG. 13, in some embodiments, a barrier layer 380 is formed over the insulating layer 370 and a sidewall 332 of a shaping film 330 according to a step 212 in FIG. 1. In some embodiments, the barrier layer 380 has a uniform thickness. In some embodiments, a terminal surface 382 of the barrier layer 380 is coplanar with a lower surface 331 of the shaping film 330.

Figure 14:
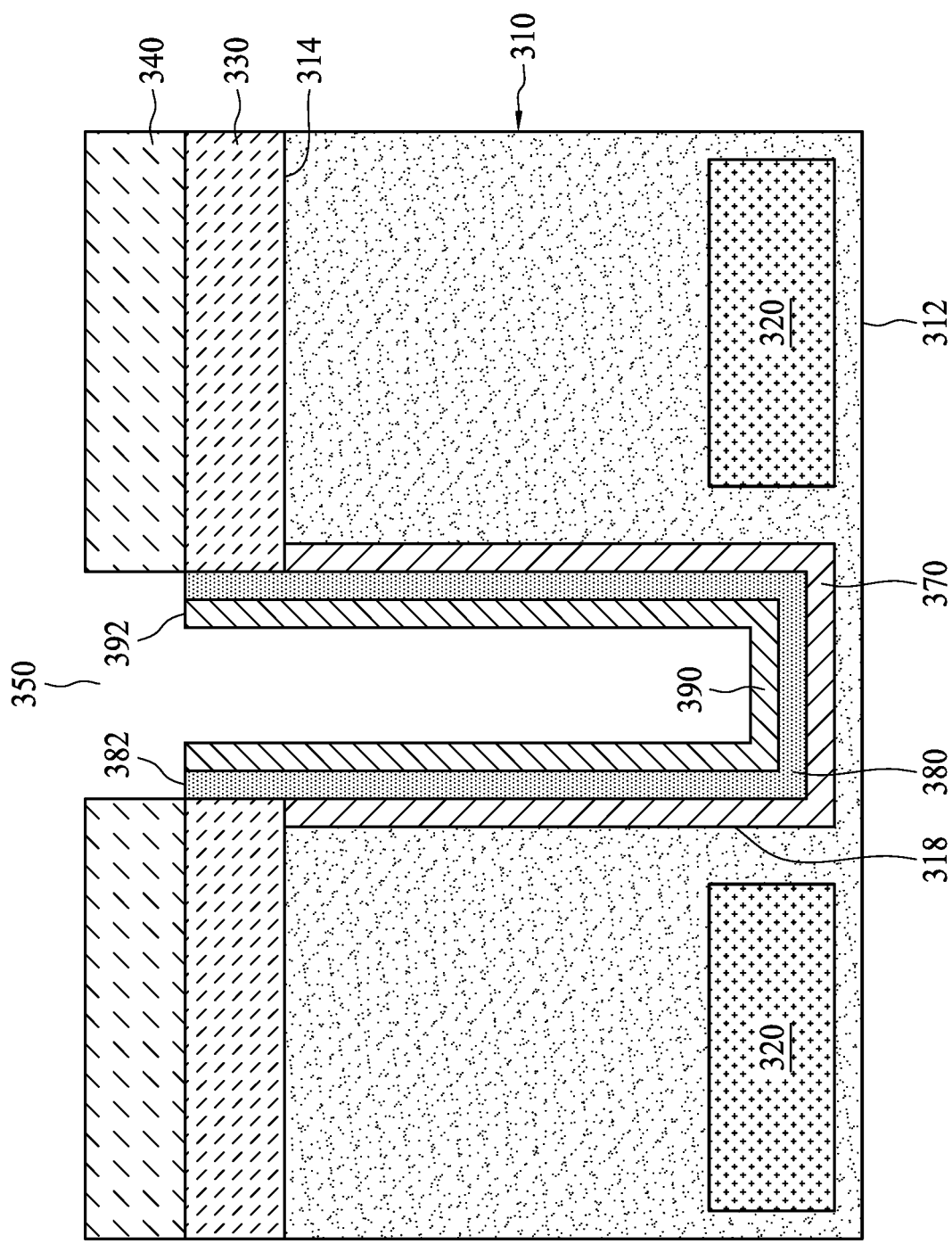

Referring to FIG. 14, in some embodiments, an optional seed layer 390 is formed over the barrier layer 380 according to a step 214 in FIG. 1. In some embodiments, the seed layer 390 has a uniform thickness. In some embodiments, a terminal surface 392 of the seed surface 390 is coplanar with the lower surface 331.

Figure 15:
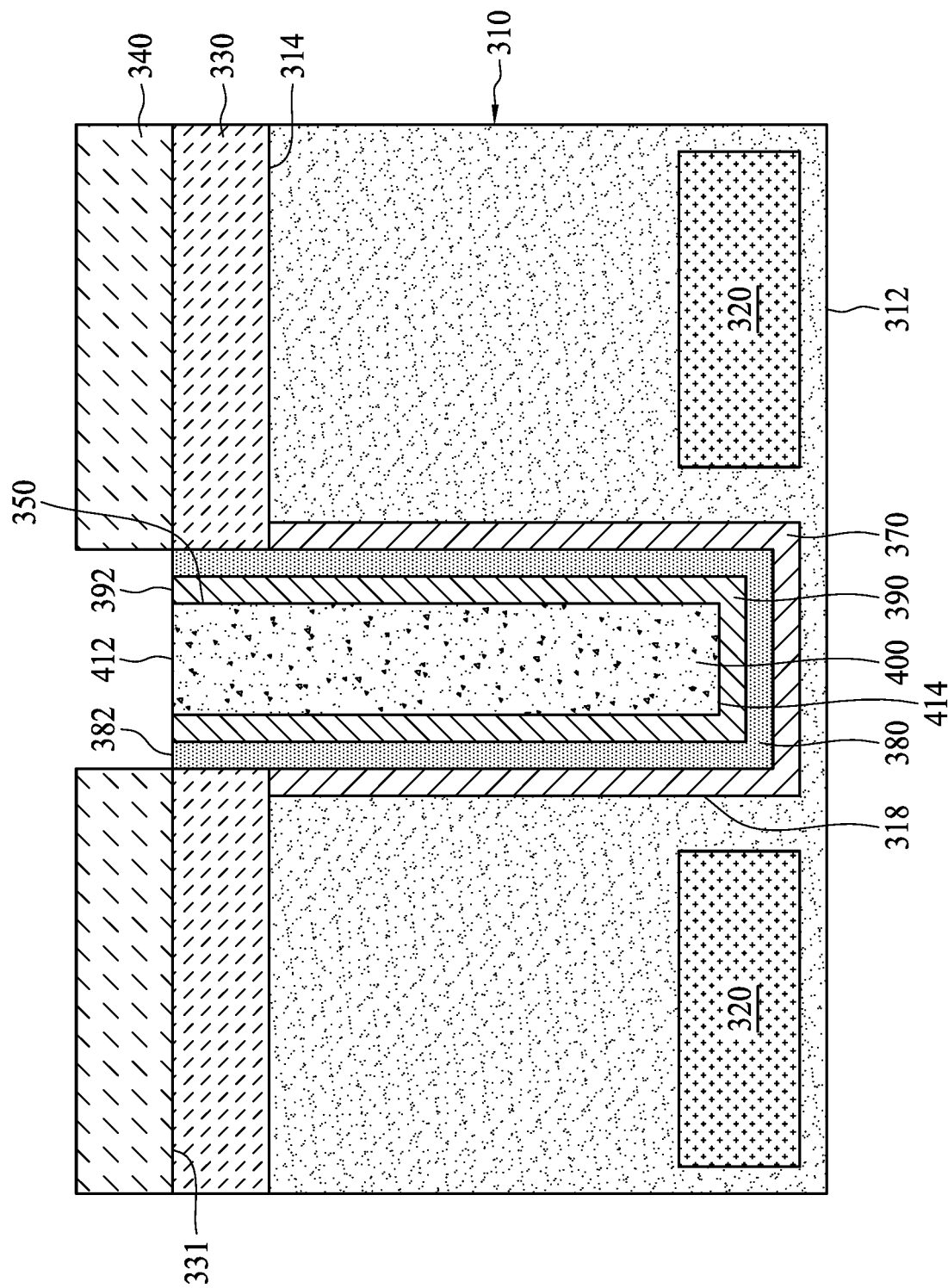

Referring to FIG. 15, a conductive material 400 is deposited in the hole 350 surrounded by the seed layer 390 according to a step 216 in FIG. 1. In some embodiments, the conductive material 400 has a second coefficient of thermal expansion substantially less than the first coefficient of thermal expansion. In some embodiments, the conductive material 400 has a thickness sufficient to fill the hole 350. In some embodiments, a planarizing process is performed on a semiconductor structure shown in FIG. 15 to remove excess portions of the conductive material 400 over the terminal surfaces 382 and 392. In some embodiments, a first end surface 412 of the conductive line 410 is coplanar with the lower surface 331. In some embodiments, a second end surface 414 of the conductive line 410, parallel to the first end surface 412, is interfaced with the seed layer 390. In some embodiments, the conductive material 400 includes copper.

Figure 16:
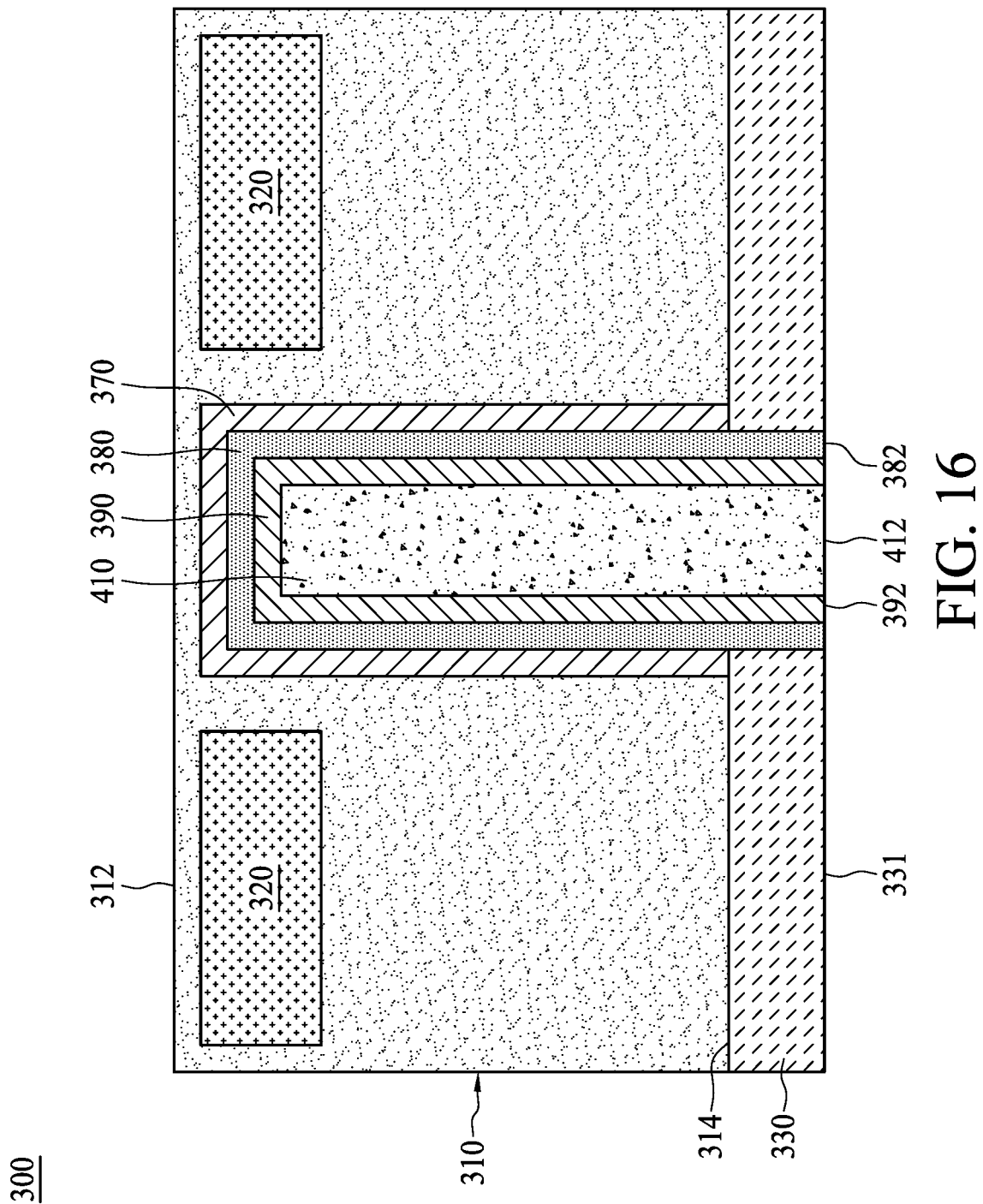

Referring to FIG. 16, the patterned photoresist 340 disposed over the shaping film 330 is properly removed to expose the lower surface 331 according to a step 218 in FIG. 1. As a result, the through silicon via structure 300 of the present disclosure is formed. In some embodiments, the through silicon via structure 300 includes a semiconductor substrate 310, a shaping film 330, an insulating layer 370, a barrier layer 380, and a conductive line 410. In some embodiments, the shaping film 330 is disposed on a back surface 314 of the semiconductor substrate 310, and the conductive line 410 is disposed through the shaping film 330 and in the semiconductor substrate 310. In some embodiments, the barrier layer 380 surrounds the conductive line 410, and the insulating layer 370 partially surrounds the barrier layer 380 and is buried in the semiconductor substrate 310. In some embodiments, the through silicon via structure 300 further includes a seed layer 390 disposed between the conductive line 410 and the barrier layer 380. In some embodiments, the through silicon via structure 300 further includes a plurality of semiconductor devices 320 disposed in the semiconductor substrate 310 and near its front surface 312, wherein the front surface 312 is opposite to the back surface 314.

In some embodiments, the semiconductor substrate 310 has a first coefficient of thermal expansion, the conductive line 410 has a second coefficient of thermal expansion greater than the first coefficient of thermal expansion, and the shaping film 330 has a third coefficient of thermal expansion less than the first coefficient of thermal expansion. In some embodiments, the shaping film 330 is configured to maintain a planar formation of the semiconductor substrate 310. In some embodiments, the shaping film 330 includes a compressive material and applies compression to the semiconductor substrate 310 when the semiconductor substrate 310 is subjected to a tensile stress produced by the conductive line 410. In some embodiments, the shaping film 330 includes a tensile material and applies tension to the semiconductor substrate 310 when the semiconductor substrate 310 is subjected to a compressive stress produced by the conductive line 410.

In conclusion, with the configuration of the through silicon via structure 300, the compressive or tensile stress applied to the semiconductor substrate 310 can be reduced, and warping of the semiconductor substrate 310 can thus be reduced.

One aspect of the present disclosure provides a through silicon via structure. In some embodiments, the through silicon via structure includes a semiconductor substrate, a shaping film, a conductive line, a barrier layer, and an insulating layer. In some embodiments, the shaping film is disposed over a back surface of the semiconductor substrate, and is configured to maintain a planar formation of the semiconductor substrate. In some embodiments, the conductive line is disposed through the shaping film and in the semiconductor substrate. In some embodiments, the barrier layer surrounds the conductive line, and the insulating layer surrounds the barrier layer.

One aspect of the present disclosure provides a method for manufacturing a through silicon via structure. In some embodiments, the method includes steps of providing a semiconductor substrate; depositing a shaping film over a back surface of the semiconductor substrate; forming a hole through the shaping film and in the semiconductor substrate; forming an insulating layer in the hole; depositing a barrier layer over the insulating layer; and depositing a conductive material in the hole.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiment as described herein may be utilized according to the present disclosure. Accordingly, the appended claims are intended to include within their scope such processes, machines, manufacture, compositions of matter, means, methods, or steps.

What is claimed is:

1. A through silicon via structure, comprising:
a semiconductor substrate;
a shaping film disposed over a back surface of the semiconductor substrate, and configured to maintain a planar formation of the semiconductor substrate;
a conductive line disposed through the shaping film and in the semiconductor substrate;
a barrier layer surrounding the conductive line; and
an insulating layer at least surrounding a portion of the barrier layer;
wherein the shaping film comprises a tensile material and applies tension to the semiconductor substrate when the semiconductor substrate bulges toward a front surface opposite to the back surface due to warping;
wherein the shaping film comprises gallium nitride.

2. The through silicon via structure of claim 1, wherein the semiconductor substrate has a first coefficient of thermal expansion, the conductive line has a second coefficient of thermal expansion greater than the first coefficient of thermal expansion, and the shaping film has a third coefficient of thermal expansion less than the first coefficient of thermal expansion.

3. The through silicon via structure of claim 1, wherein the shaping film comprises a compressive material and applies compression to the semiconductor substrate when the semiconductor substrate bulges toward the back surface due to warping.

4. The through silicon via structure of claim 3, wherein the shaping film comprises compressive silicon oxide, silicon nitride, or high compressive nitride.

5. The through silicon via structure of claim 1, wherein the shaping film is a multi-layered structure and comprises one or more first layers and one or more second layers arranged in a staggered configuration, wherein one of the first layers comprises oxide and is connected to the back surface.

6. The through silicon via structure of claim 5, wherein the second layer includes polysilicon or photoresist.

7. A through silicon via structure, comprising:
a semiconductor substrate;
a shaping film disposed over a back surface of the semiconductor substrate, and configured to maintain a planar formation of the semiconductor substrate;
a conductive line disposed through the shaping film and in the semiconductor substrate;
a barrier layer surrounding the conductive line; and
an insulating layer at least surrounding a portion of the barrier layer;
wherein a first end surface of the conductive line and a terminal surface of the barrier layer are coplanar with a lower surface, away from the back surface, of the shaping film;
wherein the insulating layer is a deposition layer and a terminal surface of the insulating layer is coplanar with the lower surface.

8. The through silicon via structure of claim 7, wherein a second end surface of the conductive line, opposite to the first end surface of the conductive line, is interfaced with the barrier layer.

9. The through silicon via structure of claim 7, wherein the insulating layer is a thermal oxide layer and a terminal surface of the insulating layer is coplanar with the back surface.

10. The through silicon via structure of claim 7, further comprising a seed layer disposed between the conductive line and the barrier layer.

11. The through silicon via structure of claim 10, wherein the barrier layer, the insulating layer, and the seed layer have uniform thicknesses.

12. A method for manufacturing a through silicon via structure, comprising:
providing a semiconductor substrate;
depositing a shaping film over a back surface of the semiconductor substrate;
forming a hole through the shaping film and in the semiconductor substrate, wherein the step of forming the hole through the shaping film and in the semiconductor substrate comprises:
providing a patterned photoresist over the shaping film; and
etching unnecessary portions of the shaping film and the semiconductor substrate away by using the patterned photoresist as a mask;
forming an insulating layer in the hole;
depositing a barrier layer over the insulating layer;
depositing a conductive material in the hole; and
removing the patterned photoresist after the depositing of the conductive material.

13. The method of claim 12, further comprising:
depositing a seed layer over the barrier layer.

14. The method of claim 12, wherein the insulating layer is formed by a thermal oxidation process.

* * * * *